(12) United States Patent
Kiyose

(10) Patent No.: US 11,508,588 B2
(45) Date of Patent: Nov. 22, 2022

(54) SUBSTRATE TREATMENT DEVICE AND SUBSTRATE TREATMENT METHOD

(71) Applicant: TOKYO ELECTRON LIMITED, Tokyo (JP)

(72) Inventor: Hiromi Kiyose, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 185 days.

(21) Appl. No.: 16/616,062

(22) PCT Filed: May 10, 2018

(86) PCT No.: PCT/JP2018/018038
§ 371 (c)(1),
(2) Date: Nov. 22, 2019

(87) PCT Pub. No.: WO2018/216476
PCT Pub. Date: Nov. 29, 2018

(65) Prior Publication Data
US 2020/0090958 A1     Mar. 19, 2020

(30) Foreign Application Priority Data

May 24, 2017   (JP) .............................. JP2017-102455

(51) Int. Cl.
*H01L 21/67*    (2006.01)
*H01L 21/66*    (2006.01)
*H01L 21/02*    (2006.01)

(52) U.S. Cl.
CPC .. *H01L 21/67034* (2013.01); *H01L 21/02101* (2013.01); *H01L 21/67253* (2013.01); *H01L 22/26* (2013.01)

(58) Field of Classification Search
CPC ......... H01L 21/67034; H01L 21/02101; H01L 21/67253; H01L 22/26; H01L 21/02057;
(Continued)

(56) References Cited

U.S. PATENT DOCUMENTS 6,281,470 B1 *   8/2001   Adachi ................. H01L 21/268
                                                    219/121.62
2002/0009658 A1 *   1/2002   Sato .................. H01L 21/67781
                                                    430/30

(Continued)

FOREIGN PATENT DOCUMENTS

JP      2002-50668 A      2/2002
JP      2007-212219 A     8/2007

(Continued)

*Primary Examiner* — Alexander Markoff
(74) *Attorney, Agent, or Firm* — Nath, Goldberg & Meyer; Jerald L. Meyer; Tanya E. Harkins

(57) ABSTRACT

A substrate treatment device according to an embodiment includes: a liquid treatment part configured to supply a liquid onto a substrate to form a liquid film remaining in a liquid state on the substrate; an imaging part configured to capture an image of a front surface of the substrate, on which the liquid film remaining in the liquid state is formed; a determination part configured to determine a quality of a formation state of the liquid film based on the captured image of the substrate; and a post-treatment part configured to treat the substrate on which the liquid film is formed, when the determination part determines that the formation state of the liquid film is good.

9 Claims, 9 Drawing Sheets

(58) Field of Classification Search
CPC ......... H01L 21/67173; H01L 21/67028; H01L 21/67051; H01L 21/67703
See application file for complete search history.

(56) References Cited

U.S. PATENT DOCUMENTS

| | | | | |
|---|---|---|---|---|
| 2002/0145733 | A1* | 10/2002 | Wada | G01N 21/956 356/237.2 |
| 2003/0017658 | A1* | 1/2003 | Nishitani | H01L 21/02595 438/149 |
| 2003/0172954 | A1* | 9/2003 | Verhaverbeke | B08B 3/12 134/147 |
| 2004/0020518 | A1* | 2/2004 | DeYoung | H01L 21/02063 134/30 |
| 2004/0065547 | A1* | 4/2004 | Stevens | H01L 21/67253 204/405 |
| 2004/0105096 | A1* | 6/2004 | Takami | G01N 21/211 356/369 |
| 2004/0216772 | A1* | 11/2004 | Xu | H01L 21/02101 134/36 |
| 2005/0048383 | A1* | 3/2005 | Taniguchi | H01L 21/02678 430/5 |
| 2005/0078298 | A1* | 4/2005 | Takami | H01L 21/67115 356/30 |
| 2005/0191861 | A1* | 9/2005 | Verhaverbeke | H01L 21/02063 438/745 |
| 2005/0199596 | A1* | 9/2005 | Takami | B23K 26/0006 219/121.65 |
| 2006/0065294 | A1* | 3/2006 | Xu | H01L 21/02101 134/34 |
| 2007/0002308 | A1* | 1/2007 | Takami | H01L 21/67253 356/30 |

FOREIGN PATENT DOCUMENTS

| | | | |
|---|---|---|---|
| JP | 2008-34612 | A | 2/2008 |
| JP | 2012-114361 | A | 6/2012 |
| JP | 2013-12538 | A | 1/2013 |
| JP | 2015-179751 | A | 10/2015 |
| JP | 2016-100565 | A | 5/2016 |
| JP | 2016-212008 | A | 12/2016 |
| KR | 10-2015-0109260 | A | 10/2015 |
| TW | 200524026 | A * | 7/2005 ........... G03F 7/3021 |

* cited by examiner

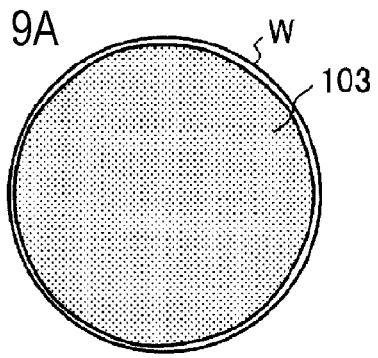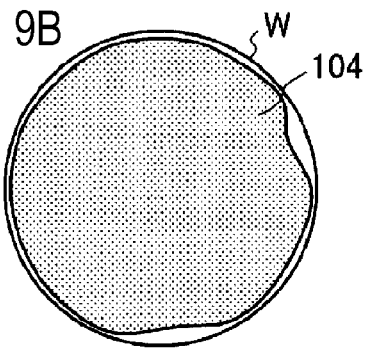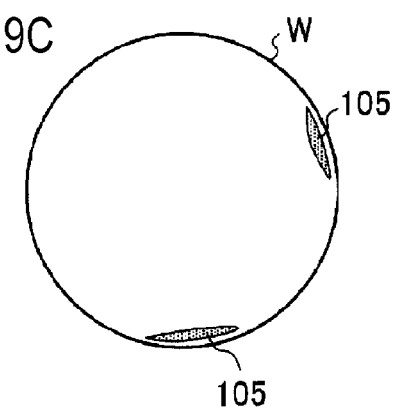

SUBSTRATE TREATMENT DEVICE AND SUBSTRATE TREATMENT METHOD

CROSS-REFERENCE TO RELATED APPLICATION

This is a National Phase Application filed under 35 U.S.C. 371 as a national stage of PCT/JP2018/018038, filed May 10, 2018, an application claiming the benefit of Japanese Application No. 2017-102455, filed May 24, 2017, the content of each of which is hereby incorporated by reference in its entirety.

TECHNICAL FIELD

The present disclosure relates to a substrate treatment device and a substrate treatment method.

BACKGROUND

There is known a substrate treatment device which forms a drying-prevention liquid film on a surface of a semiconductor wafer (hereinafter, referred to as a wafer) or the like, which is a substrate, and brings the wafer having the liquid film formed thereon into contact with a treatment fluid remaining in a supercritical state to dry the wafer (for example, see Patent document 1).

PRIOR ART DOCUMENT

Patent Documents

Patent Document 1: Japanese Laid-Open Patent Publication No. 2013-12538

SUMMARY

However, in such a substrate treatment device, the state of the surface of the wafer, a discharge amount of the drying-prevention liquid or the like is varied, which may change the state of the liquid film formed on the surface of the wafer. Further, in a case where the drying is performed in a state where the formation state of the liquid film is poor, patterns formed on the wafer may collapse, which causes degradation in throughput of the wafer.

One aspect of an embodiment is made in view of this problem, and an object of the present disclosure is to provide a substrate treatment device and a substrate treatment method which are capable of enhancing the throughput of a wafer.

A substrate treatment device according to an aspect of an embodiment includes: a liquid treatment part configured to supply a liquid onto a substrate to form a liquid film remaining in a liquid state on the substrate; an imaging part configured to capture an image of a front surface of the substrate, on which the liquid film remaining in the liquid state is formed; a determination part configured to determine a quality of a formation state of the liquid film based on the captured image of the substrate; and a post-treatment part configured to treat the substrate on which the liquid film is formed, when the determination part determines that the formation state of the liquid film is good.

According to an aspect of an embodiment, it is possible to enhance the throughput of a wafer.

BRIEF DESCRIPTION OF DRAWINGS

FIGS. 9A to 9C are views schematically illustrating an example of a determination process in a modification of the embodiment.

DETAILED DESCRIPTION

Hereinafter, embodiments of a substrate treatment device and a substrate treatment method of the present disclosure will be described in detail with reference to the accompanying drawings. Further, the present disclosure is not limited to the embodiments described below.

<Outline of Substrate Treatment System>

Figure 1:
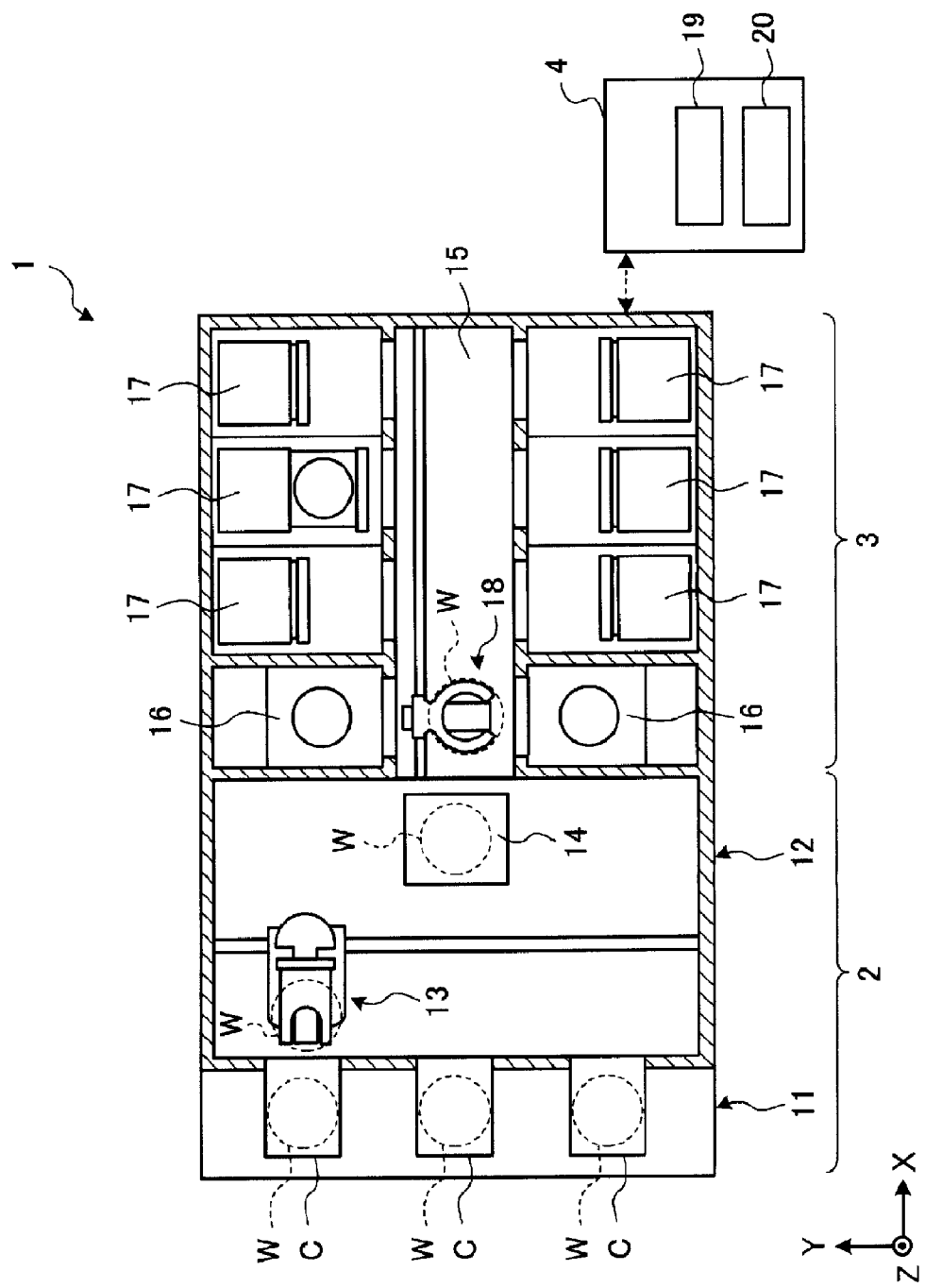
FIG. 1 is a schematic diagram illustrating a schematic configuration of a substrate treatment system according to an embodiment.

First, a schematic configuration of a substrate treatment system 1 according to an embodiment will be described with reference to FIG. 1. FIG. 1 is a view illustrating the schematic configuration of the substrate treatment system 1 according to the embodiment. For the clarification of a positional relationship, an X-axis direction, a Y-axis direction and a Z-axis direction, which are orthogonal to one another, are defined in the following description and a positive Z-axis direction is defined as a vertical upward direction.

As illustrated in FIG. 1, the substrate treatment system 1 includes a loading/unloading station 2 and a processing station 3. The loading/unloading station 2 and the processing station 3 are provided adjacent to each other.

The loading/unloading station 2 includes a carrier mounting part 11 and a transfer part 12. A plurality of carriers C that accommodate a plurality of semiconductor wafers W (hereinafter, referred to as wafers W) are mounted on the carrier mounting part 11 in a horizontal posture.

The transfer part 12 is provided adjacent to the carrier mounting part 11, and includes a substrate transfer device 13 and a delivery part 14 provided therein. The substrate transfer device 13 includes a wafer holding mechanism configured to hold the wafer W. Further, the substrate transfer device 13 is movable in horizontal and vertical directions and swivable about a vertical axis, and transfers the wafer W between the carrier C and the delivery part 14 using the wafer holding mechanism.

The processing station 3 is provided adjacent to the transfer part 12. The processing station 3 includes a transfer part 15, a plurality of cleaning units 16, and a plurality of drying units 17. The plurality of cleaning units 16 and the plurality of drying units 17 are arranged at both sides of the transfer part 15. Further, the arrangement and the numbers of the cleaning units 16 and the drying units 17 illustrated in FIG. 1 are examples and are not limited to those illustrated in FIG. 1.

The transfer part 15 includes a substrate transfer device 18 provided therein. The substrate transfer device 18 includes a wafer holding mechanism configured to hold the wafer W. Further, the substrate transfer device 18 is movable in horizontal and vertical directions and swivable about a vertical axis, and transfers the wafer W between the delivery part 14, the cleaning unit 16, and the drying unit 17 using the wafer holding mechanism.

The cleaning unit 16 performs a predetermined cleaning treatment on the wafer W transferred by the substrate transfer device 18. An exemplary configuration of the cleaning unit 16 will be described below.

The drying unit 17 performs a predetermined drying treatment on the wafer W cleaned by the cleaning unit 16. An exemplary configuration of the drying unit 17 will be described below.

Further, the substrate treatment system 1 includes a controller 4. The controller 4, for example, is a computer, and includes a control part 19 and a storage part 20.

The control part 19 is provided with a microcomputer having a central processing unit (CPU), a read only memory (ROM), a random access memory (RAM), input/output ports and the like, and various circuits. The CPU of the microcomputer controls the transfer part 12, the transfer part 15, the cleaning unit 6, the drying unit 17, an imaging part 41 (see FIG. 3, an adjustment part 42 (see FIG. 4) and the like by reading and executing a program stored in the ROM.

Further, the program is recorded in a computer-readable recording medium, and may be installed on the storage part 20 of the controller 4 from the recording medium. Example of the computer-readable recording medium may include a hard disk (HD), a flexible disk (FD), a compact disk (CD), a magneto-optical (MO) disk, a memory card and the like.

The storage part 20 may be implemented by a semiconductor memory element such as an RAM, a flash memory or the like, or a storage device such as a hard disk, an optical disk or the like. An exemplary configuration of the controller 4 will be described below.

In the substrate treatment system 1 configured as above, first, the substrate transfer device 13 of the loading/unloading station 2 picks up the wafer W from the carrier C mounted on the carrier mounting part 11, and mounts the picked-up wafer W on the delivery part 14. The wafer W mounted on the delivery part 14 is picked up by the substrate transfer device 18 of the processing station 3, and loads the same into the cleaning unit 16.

The wafer W loaded into the cleaning unit 16 is subjected to a cleaning treatment in the cleaning unit 16, and subsequently, is unloaded from the cleaning unit 16 by the substrate transfer device 18. The wafer W unloaded from the cleaning unit 16 is loaded into the drying unit 17 by the substrate transfer device 18, and subsequently, is subjected to a drying treatment in the drying unit 17.

The wafer W subjected to the drying treatment in the drying unit 17 is unloaded from the drying unit 17 by the substrate transfer device 18, and is mounted on the delivery part 14. Further, the processed wafer W mounted on the delivery part 14 is returned to the carrier C of the carrier mounting part 11 by the substrate transfer device 13.

<Outline of Cleaning Unit>

Figure 2:
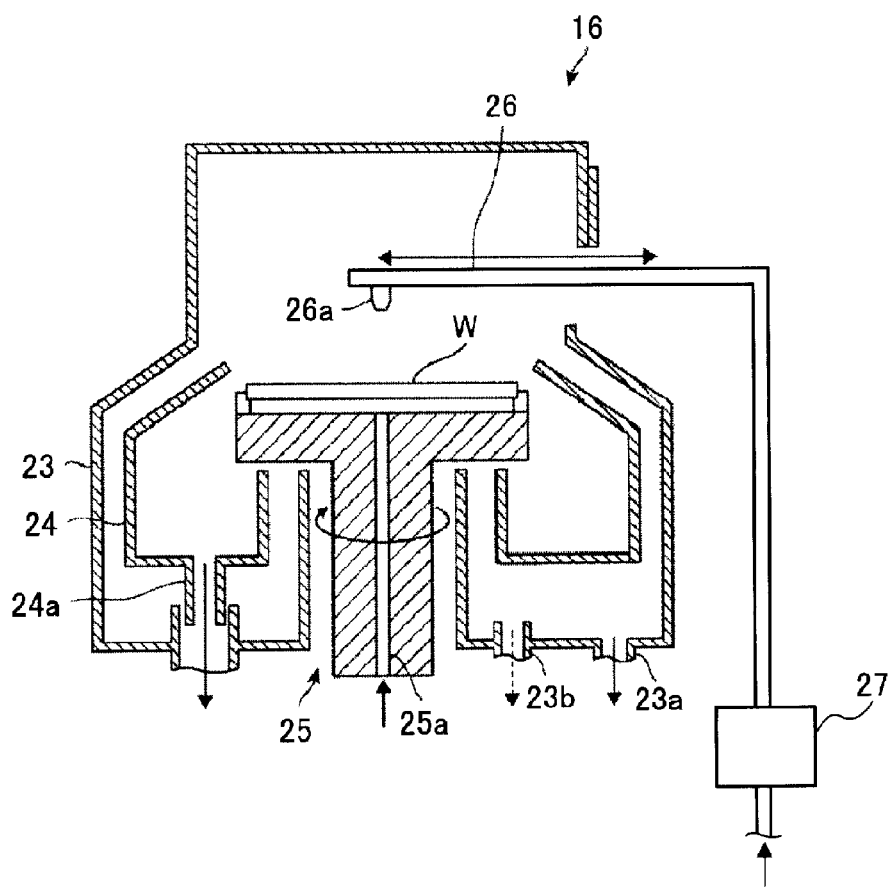
FIG. 2 is a cross-sectional view illustrating a configuration of a cleaning unit according to the embodiment.

Next, a schematic configuration of the cleaning unit 16 will be described with reference to FIG. 2. FIG. 2 is a cross-sectional view illustrating the configuration of the cleaning unit 16 according to the embodiment. Further, the cleaning unit 16 is an example of a liquid treatment part. For example, the cleaning unit 6 may be configured as a single wafer type cleaning unit that cleans the wafers W one by one by spin cleaning.

As illustrated in FIG. 2, the cleaning unit 16 holds the wafer W in a substantially horizontal posture by a wafer holding mechanism 25 disposed inside an outer chamber 23 that defines a processing space. The cleaning unit 16 rotates the wafer W by rotating the wafer holding mechanism 25 about a vertical axis. Further, the cleaning unit 16 moves a nozzle arm 26 above the rotating wafer W, and cleans a front surface of the wafer W by supplying a chemical liquid or a rinsing liquid from a chemical liquid nozzle 26a provided at a distal end of the nozzle arm 26 in a predetermined sequence.

Further, the cleaning unit 16 has a chemical liquid supply passage 25a provided inside the wafer holding mechanism 25. Further, a rear surface of the wafer W is cleaned by the chemical or the rinsing liquid supplied from the chemical liquid supply passage 25a.

In the aforementioned cleaning treatment of the wafer W, particles or organic contaminants are initially removed by an SC1 liquid (a mixture liquid of ammonia and hydrogen peroxide) that is a chemical liquid showing alkalinity, and subsequently, a rinse-cleaning based on a deionized water (hereinafter, referred to as DIW) as a rinsing liquid is performed. Thereafter, removal of a natural oxide film based on a diluted hydro fluoric acid (hereinafter, referred to as DHF) as a chemical liquid showing acidity is performed. Subsequently, the rinse-cleaning based on the DIW is performed.

The various kinds of chemical liquids described above are introduced into the outer chamber 23 or an inner cup 24 disposed inside the outer chamber 23, and are discharged from a liquid drain port 23a formed in the bottom of the outer chamber 23 or a liquid drain port 24a formed in the bottom of the inner cup 24. Further, an internal atmosphere of the outer chamber 23 is exhausted from an exhaust port 13b formed in the bottom of the outer chamber 23.

After the above-described rinse-cleaning of the wafer W, IPA (hereinafter, referred to as "IPA liquid") remaining in a liquid state is supplied to both the front surface and the rear surface of the wafer W while the wafer holding mechanism 25 is rotated, so that the DIW residing on the both surfaces of the wafer W is replaced with the supplied IPA liquid. Thereafter, the rotation of the wafer holding mechanism 25 is slowly stopped.

The wafer W subjected to the cleaning treatment in this way is delivered on the substrate transfer device 18 by a delivery mechanism (not illustrated) provided in the wafer holding mechanism 25 in a state where the IPA liquid gathers on the front surface of the wafer W (in a state where the liquid film of the IPA liquid is formed on the front surface of the wafer W), and is unloaded from the cleaning unit 16.

The IPA liquid gathered on the front surface of the wafer W functions as a drying-prevention liquid that prevents patterns from collapsing when the liquid on the front surface of the wafer W is evaporated (vaporized) in the course of transferring the wafer W from the cleaning unit 16 to the drying unit 17 or the course of loading the wafer W into the drying unit 17. Further, the cleaning unit 16 includes a cooling part 27 that cools down an IPA liquid discharged previously from the chemical liquid nozzle 26a to a melting point (−89.5 degrees C. for IPA) or higher and room temperature or less.

After the cleaning treatment of the cleaning unit 16 is completed, the wafer W having the IPA liquid gathered on the front surface thereof is transferred to the drying unit 17. In the drying unit 17, the IPA liquid on the front surface of the wafer W is brought into contact with a treatment fluid (hereinafter, also referred to as "a supercritical fluid") of $CO_2$ that remains in a supercritical state, so that the IPA liquid is dissolved in the supercritical fluid and is removed. In this manner, the drying treatment of the wafer W is performed.

<Outline of Drying Unit>

Figure 3:
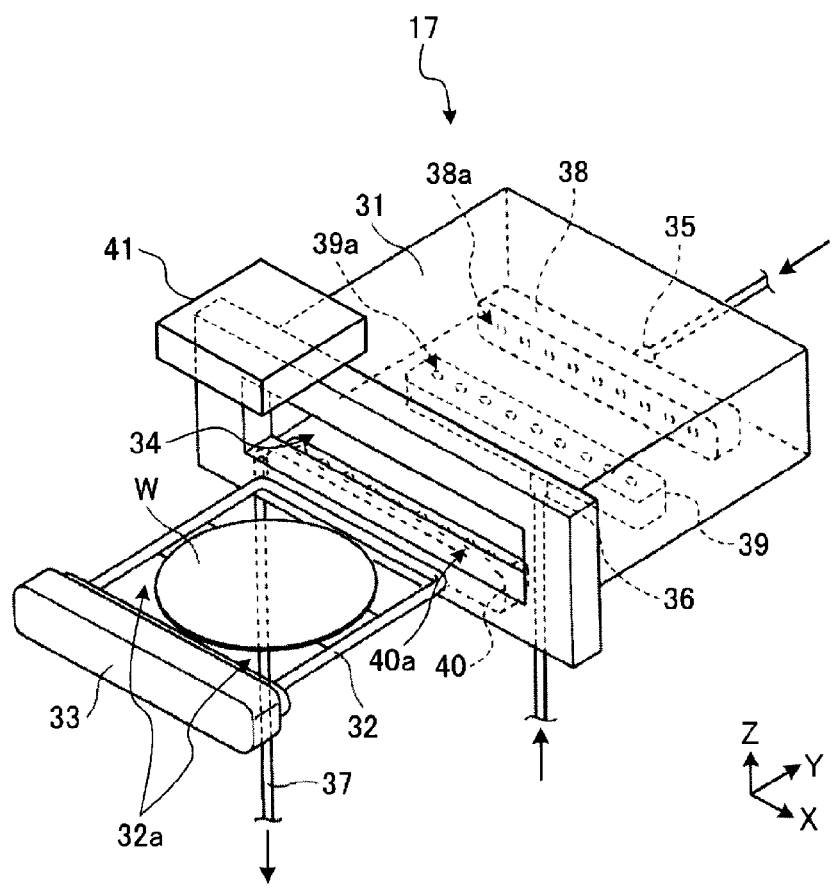
FIG. 3 is an external perspective view illustrating a configuration of a drying unit according to the embodiment.

Next, a configuration of the drying unit 17 will be described. FIG. 3 is an external perspective view illustrating the configuration of the drying unit 17 according to the embodiment. Further, the drying unit 17 is an example of a post-treatment part.

The drying unit 17 includes a body 31 of a housing shape, a holding plate 32, and a cover member 33. The body 31 has an opening 34 formed to transfer the wafer W therethrough. The holding plate 32 holds the wafer W to be processed in a horizontal posture. The cover member 33 seals the opening 34 when the wafer W is loaded into the body 31 while supporting the holding plate 32.

The body 31 is a container having a processing space defined therein, which is capable of accommodating the wafer W having the diameter of, for example, 300 mm. Supply ports 35 and 36 and a discharge port 37 are provided in a wall portion of the body 31. The supply ports 35 and 36 and the discharge port 37 are connected to a supply passage and a discharge passage for flowing the supercritical fluid therethrough, which are provided at upstream and downstream sides of the drying unit 17, respectively.

The supply port 35 is connected to a lateral surface opposite to the opening 34 in the body 31 having a housing shape. Further, the supply port 36 is connected to a bottom surface of the body 31. Further, the discharge port 37 is connected to a lower side of the opening 34. Further, although two supply ports 35 and 36 and one discharge port 37 are illustrated in FIG. 3, the numbers of the supply ports 35 and 36 and the discharge port 37 are not particularly restricted.

Further, fluid supply headers 38 and 39 and a fluid discharge header 40 are provided inside the body 31. Further, a plurality of supply holes 38a and 39a are respectively arranged step by step in the fluid supply headers 38 and 39 in lengthwise directions of the fluid supply headers 38 and 39. A plurality of discharge holes 40a are arranged step by step in the fluid discharge header 40 in a lengthwise direction of the fluid discharge header 40.

The fluid supply header 38 is connected to the supply port 35, and is provided adjacent to a lateral surface opposite to the opening 34 in interior of the body 31 of a housing shape. Further, the plurality of supply holes 38a formed to be arranged in the fluid supply header are oriented toward the opening 34.

The fluid supply header 39 is connected to the supply port 36, and is provided in the central portion of the bottom surface in the interior of the body 31 of a housing shape. Further, the plurality of supply holes 39a formed to be arranged in the fluid supply header 39 are oriented upward.

The fluid discharge header 40 is connected to the discharge port 37, and is provided adjacent to a lateral surface of the opening 34 in the interior of the body 31 of a housing shape. The fluid discharge header 40 is also provided below the opening 34. Further, the plurality of discharge holes 40a formed to be arranged in the fluid discharge header 40 are oriented upward.

The fluid supply headers 38 and 39 supply the supercritical fluid into the body 31. Further, the fluid discharge header 40 guides the supercritical fluid in the body 31 outward of the body 31 to discharge the supercritical fluid. Further, the supercritical fluid discharged outward of the body 31 through the fluid discharge header 40 contains the IPA liquid which was dissolved from the front surface of the wafer W into the supercritical fluid remaining in a supercritical state.

As the supercritical fluid is supplied into the body 31 from the respective supply holes 38a and 39a of the fluid supply headers 38 and 39 disposed as described above and the supercritical fluid is discharged from the body 31 through the discharge holes 40a of the fluid discharge header 40, a laminar flow of the supercritical fluid flowing in a predetermined direction around the wafer W is formed in the interior of the body 31.

For example, the laminar flow of the supercritical fluid flows toward an upper portion of the opening 34 along the front surface of the wafer W above the wafer W from the fluid supply header 38. Subsequently, the direction of the laminar flow of the supercritical fluid is changed from the upper portion of the opening 34 to a lower portion thereof. The laminar flow of the supercritical fluid flows toward the fluid discharge header 40 via the vicinity of the opening 34.

In an example of the laminar flow, in the interior of the drying unit 17, an opening 32a is formed between the wafer W and the cover member 33 in the holding plate 32. The laminar flow of the supercritical fluid passes through the opening 32a.

Further, from the viewpoint of reducing a load applied to the wafer W when the supercritical fluid is supplied into the body 31 and when the supercritical fluid is discharged from the body 31, the fluid supply headers and the fluid discharge header may be provided in plural.

In the interior of the drying unit 17, the IPA liquid existing between the patterns formed on the wafer W is brought into contact with the supercritical fluid remaining in a high-pressure state (for example, 16 MPa), so that the IPA liquid is slowly dissolved in the supercritical fluid and is slowly replaced with the supercritical fluid. Ultimately, the spaces between the patterns are filled with only the supercritical fluid.

Further, after the IPA liquid is removed from the spaces between the patterns, the internal pressure of the body 31 is reduced from the high-pressure to the atmospheric pressure. Thus, the treatment fluid of $CO_2$ is changed from the supercritical state to a gaseous state, so that the spaces between the patterns are occupied by the gas alone. In this way, the IPA liquid between the patterns is removed, and the drying of the wafer W is completed.

Here, the viscosity of the supercritical fluid is lower than that of a liquid (for example, the IPA liquid). The supercritical fluid has a high liquid solubility. An interface is hardly present between the supercritical fluid and a liquid or gas that is in equilibrium with the supercritical fluid. Accordingly, through the drying treatment using the supercritical fluid, it is possible to dry the liquid without being influenced by surface tension. Thus, according to the embodiment, it is possible to suppress the patterns from collapsing during the drying treatment.

Further, while in the embodiment, the IPA liquid is used as a drying-prevention liquid and $CO_2$ is used as the treatment fluid, another liquid other than the IPA may be used as the drying-prevention liquid and another fluid other than $CO_2$ may be used as the treatment fluid.

The drying unit 17 further includes a pressing mechanism (not illustrated). The pressing mechanism has a function of sealing the processing space by pressing the cover member 33 toward the body 31 against an internal pressure which may be caused by the treatment fluid remaining in the supercritical state that was supplied into the processing space inside the body 31. Further, an insulator or a tape heater may be provided on a surface of the body 31 such that the supercritical fluid supplied into the processing space is maintained at a predetermined temperature.

In the substrate treatment system 1 of the embodiment, as illustrated in FIG. 3, an imaging part 41 is provided adjacent to the drying unit 17. For example, the imaging part 41 may be a CCD camera, and may be provided at a location at which an image of the front surface of the wafer W before being loaded into the drying unit 17 can be captured. Thus, the imaging part 41 can capture the image of the front surface of the wafer W.

That is to say, the substrate treatment system 1 can determine whether a formation state of the liquid film formed on the front surface of the wafer W is good, based on the image of the front surface of the wafer W, which was captured by the imaging part 41. Here, the wording "the formation state of the liquid film formed on the front surface of the wafer W is good" used herein may mean that all the patterns formed on the front surface of the wafer W are covered with the liquid film.

Figure 4:
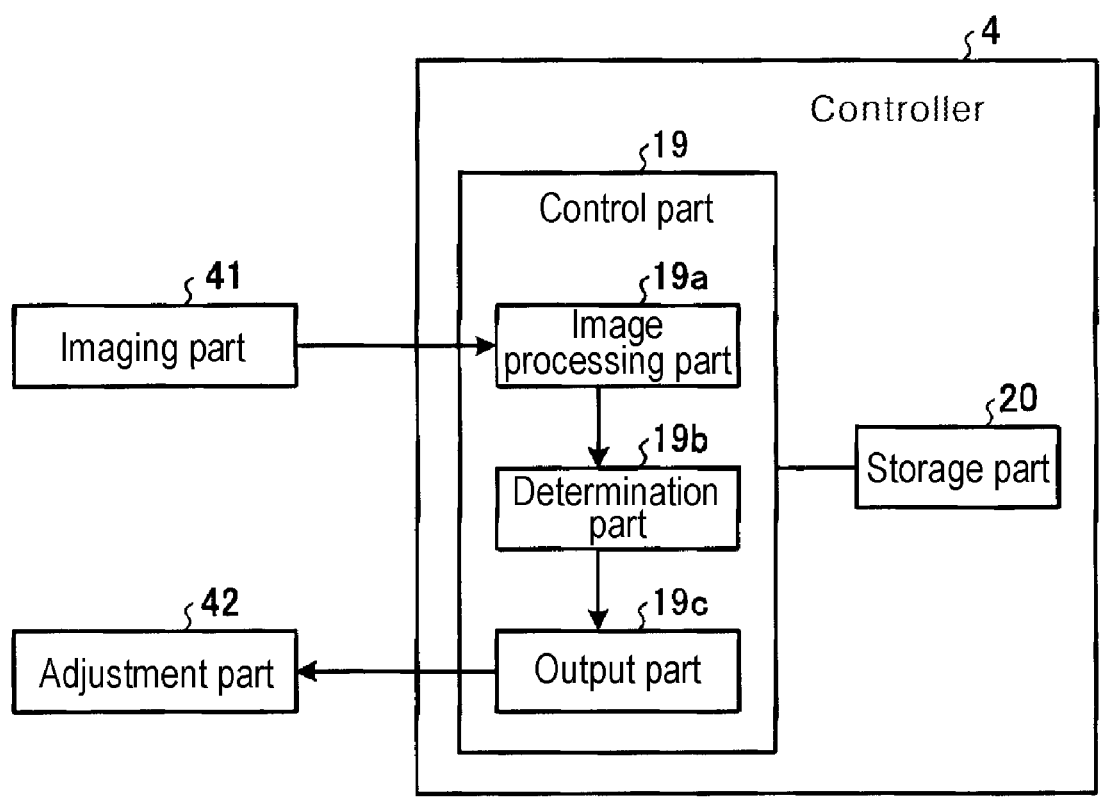
FIG. 4 is a block diagram illustrating a schematic configuration of a control part according to the embodiment.

Hereinafter, the determination process of determining the quality of the formation state of the liquid film will be described in detail with reference to FIG. 4, and FIGS. 5A and 5B. FIG. 4 is a block diagram illustrating a schematic configuration of the controller 4 according to the embodiment. The controller 4 includes a control part 19 and a storage part 20. Further, the control part 19 is provided with an image processing part 19a, a determination part 19b, and an output part 19c.

An image data of the front surface of the wafer W captured by the imaging part 41 is inputted to the image processing part 19a. The image processing part 19a performs an image processing of the inputted image data using a predetermined method. As an example, the image processing part 19a acquires contrast differences that are differential values of luminance between adjacent pixel data in the image data for each pixel, and evaluates a pixel having a high contrast difference as an edge on the image.

Figure 5A:
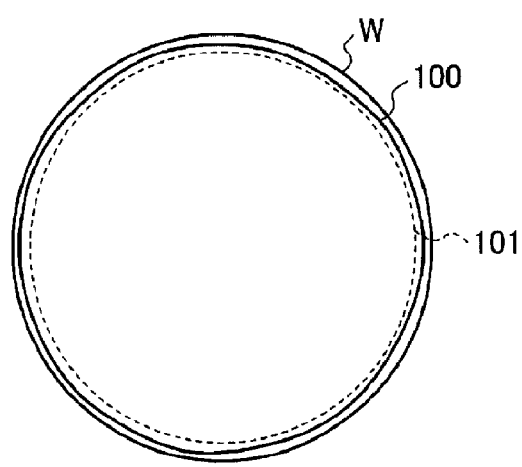
FIG. 5A is a view schematically illustrating an example of a formation state of a liquid film formed on a surface of an image-processed wafer.

FIG. 5A is a view schematically illustrating an example of the formation state of the liquid film on the front surface of the wafer W subjected to the image processing. In FIG. 5A, an edge 100 is detected on the front surface of the wafer W along an end portion of the wafer W. The edge 100 represents an interface between the liquid film of the IPA liquid on the front surface of the wafer W and a dried portion of the IPA liquid on the front surface of the wafer W. That is to say, the image of the wafer W in the present embodiment includes a pixel having a relatively high luminance value in a portion of the liquid film of the IPA liquid and a pixel having a relatively low luminance value in the dried portion. Thus, the obtained edge (the edge 100) related to luminance coincides with the interface between the liquid film and the dried portion. Further, there may be a case where the dried portion is seen as colored relative to the portion of the liquid film of the IPA liquid or a case where a change in color appears between the two portions. In this case, the interface may be determined based on the colored edge, the edge having color difference, and a combination thereof, in addition to the luminance.

Returning to FIG. 4, the other components of the control part 19 will be described. The determination part 19b receives the image data obtained by the image processing part 19a, and determines whether the formation state of the liquid film on the front surface of the wafer W is good based on the image data.

For example, as illustrated in FIG. 5A, data related to a predetermined range 101 on the front surface of the wafer W is stored in the storage part 20. The predetermined range 101 corresponds to a portion of the wafer W, in which the patterns are formed. The determination part 19b reads the data related to the predetermined range 101 from the storage part 20.

Further, in a case in which the entire edge 100 is detected outside the predetermined range 101 and the edge 100 is not detected inside the predetermined range 101, the determination part 19b considers that the entire portion in which the patterns are formed is covered with the liquid film of the IPA liquid, and determines that the formation state of the liquid film on the front surface of the wafer W is good.

Further, if it is determined that the formation state of the liquid film on the front surface of the wafer W is good, the wafer W is loaded into the drying unit 17 where the wafer W is subjected to the drying treatment.

Figure 5B:
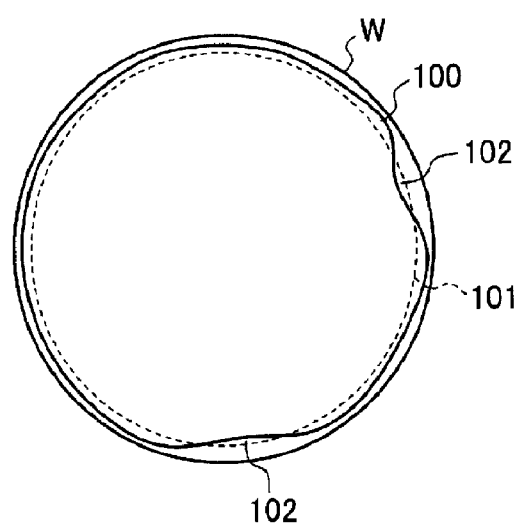
FIG. 5B is a view schematically illustrating another example of a formation state of a liquid film formed on a surface of an image-processed wafer.

Meanwhile, as illustrated in FIG. 5B, in a case in which the edge 100 is detected inside the predetermined range 101, the determination part 19b considers that defective portions 102 not covered with the liquid film of the IPA liquid are present in the portion in which the patterns are formed, and determines that the formation state of the liquid film on the front surface of the wafer W is poor. FIG. 5B is a view schematically illustrating another example of the formation state of the liquid film on the front surface of the wafer W subjected to the image processing.

As described thus far, the determination can be carried out in a short period of time by detecting the edge 100 that is the interface between the liquid film of the IPA liquid and the dried portion of the front surface of the wafer W from the captured image and determining the quality of the formation state of the liquid film based on the position of the edge 100. Thus, according to the embodiment, it is possible to shorten the overall processing time of the substrate treatment system 1. Further, although the edge 100 has been described to be used as feature obtained from the image itself, the feature is not limited to the edge 100. In a case where the liquid film is formed at good level, the wafer W has the same color or brightness all over. However, in a case where the liquid film is not formed at good level, the wafer W tends to have areas having different colors and different brightnesses together. Accordingly, at least one histogram of at least one of luminance, color difference, hue and the like as the feature of the image itself may be calculated, and the quality of the formation state of the liquid film may be determined according to whether the calculated histogram has a distribution width that is larger than a predetermined level.

If it is determined that the formation state of the liquid film on the front surface of the wafer W is poor, the output part 19c illustrated in FIG. 4 issues command to the adjustment part 42. The adjustment part 42 adjusts the formation state of the liquid film on the front surface of the wafer W based on the command.

Figure 6:
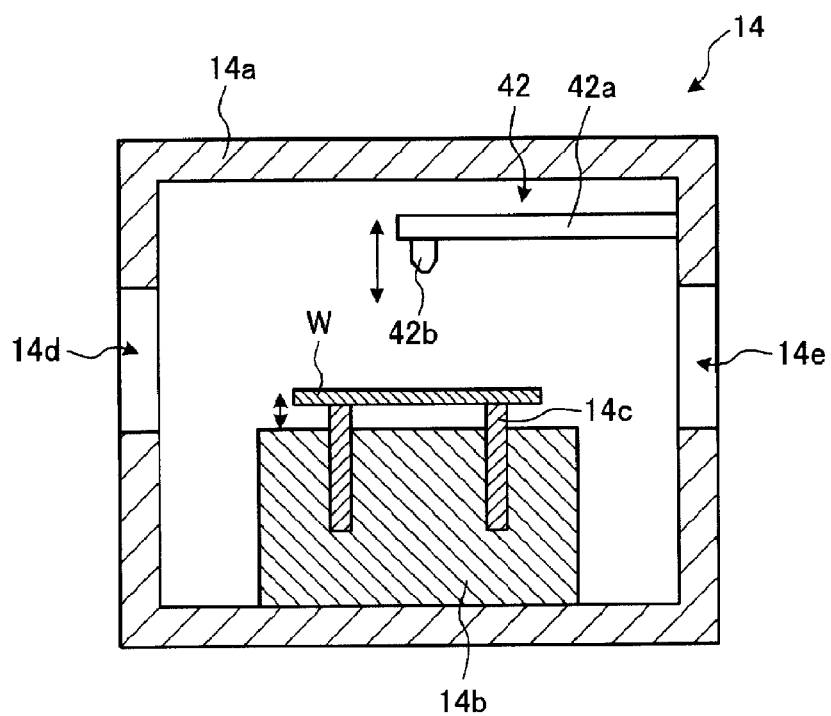
FIG. 6 is a cross-sectional view illustrating an example of a configuration of an adjustment part according to an embodiment.

FIG. 6 is a cross-sectional view illustrating an exemplary configuration of the adjustment part 42 according to the embodiment. In FIG. 6, there is illustrated an example in which the adjustment part 42 is provided in the delivery part 14. The delivery part 14 includes a case 14a, a pedestal 14b, a plurality of elevation members 14c, and the adjustment part 42. The case 14a has openings 14d and 14e through which the wafer W is transferred by the substrate transfer device 13 or the substrate transfer device 18.

The pedestal 14b is disposed inside the case 14a. Insertion holes into which the respective elevation members 14c are inserted, are formed in the pedestal 14b. The elevation members 14c are supported by the pedestal 14b such that they can be elevated by an elevation driving part (not illustrated). When the wafer W transferred by the substrate transfer device 13 or the substrate transfer device 18 is mounted on leading end portions of the elevation members 14c, the elevation members 14c support the rear surface of the wafer W.

The adjustment part 42 adjusts the formation state of the liquid film of the IPA liquid formed on the front surface of the wafer W. The adjustment part 42 includes an arm 42a and an IPA supplier 42b. The arm 42a is supported by the case 14a to be elevated by an arm driving part (not illustrated). The IPA supplier 42b is attached to the arm 42a to supply the IPA liquid onto the front surface of the wafer W while elevating together with the arm 42a.

In the embodiment, if it is determined that the formation state of the liquid film on the front surface of the wafer W is poor, first, the wafer W is transferred from the drying unit 17 to the delivery part 14 by the substrate transfer device 18. Subsequently, the adjustment part 42 that received the command from the output part 19c adjusts the formation state of the liquid film on the front surface of the wafer W.

For example, the determination part 19b estimates shortfall of the IPA liquid that gathered on the wafer W based on the distribution of the detected edge 100, and outputs data related to the estimated shortfall of the IPA liquid to the adjustment part 42 through the output part 19c. Further, the adjustment part 42 discharges the IPA liquid corresponding to the shortfall from the IPA supplier 42b onto the front surface of the wafer W. Thus, according to the present embodiment, it is possible to adjust the formation state of the liquid film on the front surface of the wafer W.

The wafer W in which the formation state of the liquid film has been adjusted, is transferred to the drying unit 17 again. In the drying unit 17, an image of the wafer W is captured by the imaging part 41 to determine whether the formation state of the liquid film on the front surface of the wafer W is good.

In the embodiment described thus far, in the case in which the formation state of the liquid film on the front surface of the wafer W is varied and is poor, it is possible to perform the adjustment with respect to the wafer W such that the formation state of the liquid film becomes good.

Accordingly, it is possible to suppress the patterns formed in the portions not covered with the liquid film from collapsing during the drying treatment based on the supercritical fluid. Thus, according to the embodiment, it is possible to improve the throughput of the wafer W in the drying treatment based on the supercritical fluid.

Further, in the embodiment, the imaging part 41 is provided adjacent to the drying unit 17. Thus, by providing the imaging part 41 adjacent to the drying unit 17, it is possible to capture the formation state of the liquid film on the wafer W just before the drying treatment.

Accordingly, it is possible to monitor the formation state of the liquid film just before the drying treatment. Thus, according to the embodiment, by drying the IPA liquid during a period of time from when the capturing is performed until the drying treatment is initiated, it is possible to suppress the throughput of the wafer W from being degraded.

Further, in the embodiment, the adjustment part 42 is provided in the delivery unit 14. Thus, by disposing the adjustment part 42 in a space in which the existing delivery part 14 is provided, it is possible to prevent the substrate treatment system 1 from being increased in size.

Further, in the embodiment, the cooling part 27 that cools down the IPA liquid before the discharging to a melting point or higher and at room temperature or less is provided in the cleaning unit 16. The cooling part 27 can suppress the IPA liquid that gathered on the front surface of the wafer W from being volatilized. This makes it possible to suppress the formation state of the liquid film from being poor due to the volatilization of the IPA liquid, which suppresses a degradation in throughput of the wafer W.

Further, in some embodiments, the temperature of the IPA liquid may be cooled down to about 15 degrees C. Further, in some embodiments, the cooling part 27 that cools down the IPA liquid before discharging may be provided in the adjustment part 42. By providing the cooling part 27 in the adjustment part 42, it is possible to suppress the IPA liquid from being volatilized after the adjustment of the formation state of the liquid film.

Further, although in the above embodiment, an example in which the imaging part 41 is a CCD camera has been described, the imaging part 41 is not limited to the CCD camera but may be any device as long as it can capture the front surface of the wafer W.

<Details of Substrate Treatment>

Figure 7:
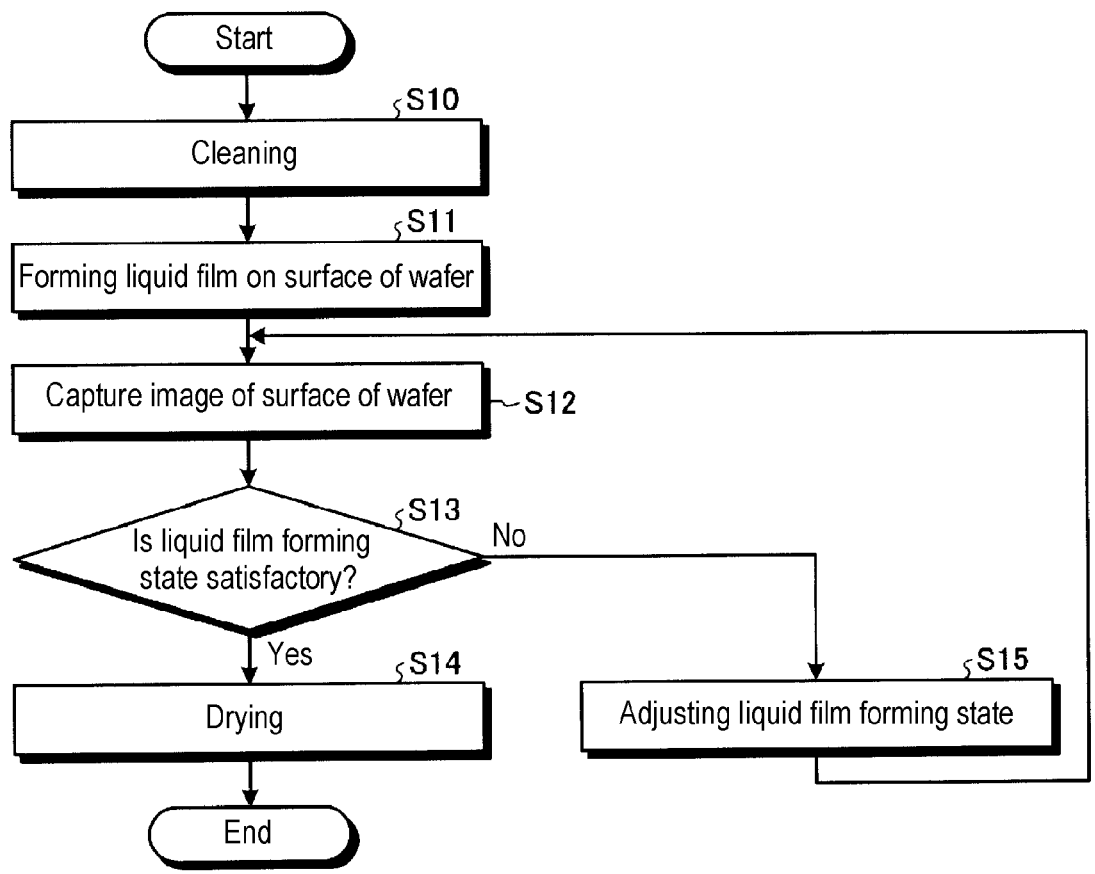
FIG. 7 is a flowchart illustrating a treatment sequence of a substrate treatment which is performed by the substrate treatment system according to the embodiment.

Next, details of the substrate treatment according to the embodiment will be described with reference to FIG. 7. FIG. 7 is a flowchart illustrating a treatment procedure of the substrate treatment which is performed by the substrate treatment system 1 according to the embodiment.

First, the wafer W is transferred from the carrier C into the cleaning unit 16 through the substrate transfer device 13, the delivery part 14, and the substrate transfer device 18. Subsequently, the control part 19 controls the cleaning unit 16 to perform the cleaning treatment on the wafer W (step S10). Subsequently, the control part 19 controls the cleaning unit 16 to perform gathering the IPA liquid with respect to the wafer W to form a liquid film on the cleaned front surface of the wafer W (step S11).

Subsequently, the control part 19 transfers the wafer W to a position adjacent to the drying unit 17 provided with the imaging part 41, and controls the imaging part 41 to capture an image of the front surface of the wafer W (step S12). Subsequently, the determination part 19b determines whether the formation state of the liquid film on the front surface of the wafer W is good based on the captured image (step S13).

If it is determined that the formation state of the liquid film on the front surface of the wafer W is good (YES in step S13), the control part 19 loads the wafer W into the drying unit 17, and controls the drying unit 17 to perform the drying treatment on the wafer W (step S14). In this way, the process is completed.

Meanwhile, if it is determined that the formation state of the liquid film on the front surface of the wafer W is poor (NO in step S13), the control part 19 transfers the wafer W to the adjustment part 42, and controls the adjustment part 42 to adjust the formation state of the liquid film on the front surface of the wafer W (step S15). Subsequently, the process returns to step S12.

<Modifications>

Next, various modifications of the above-described embodiment will be described.

Figure 8:
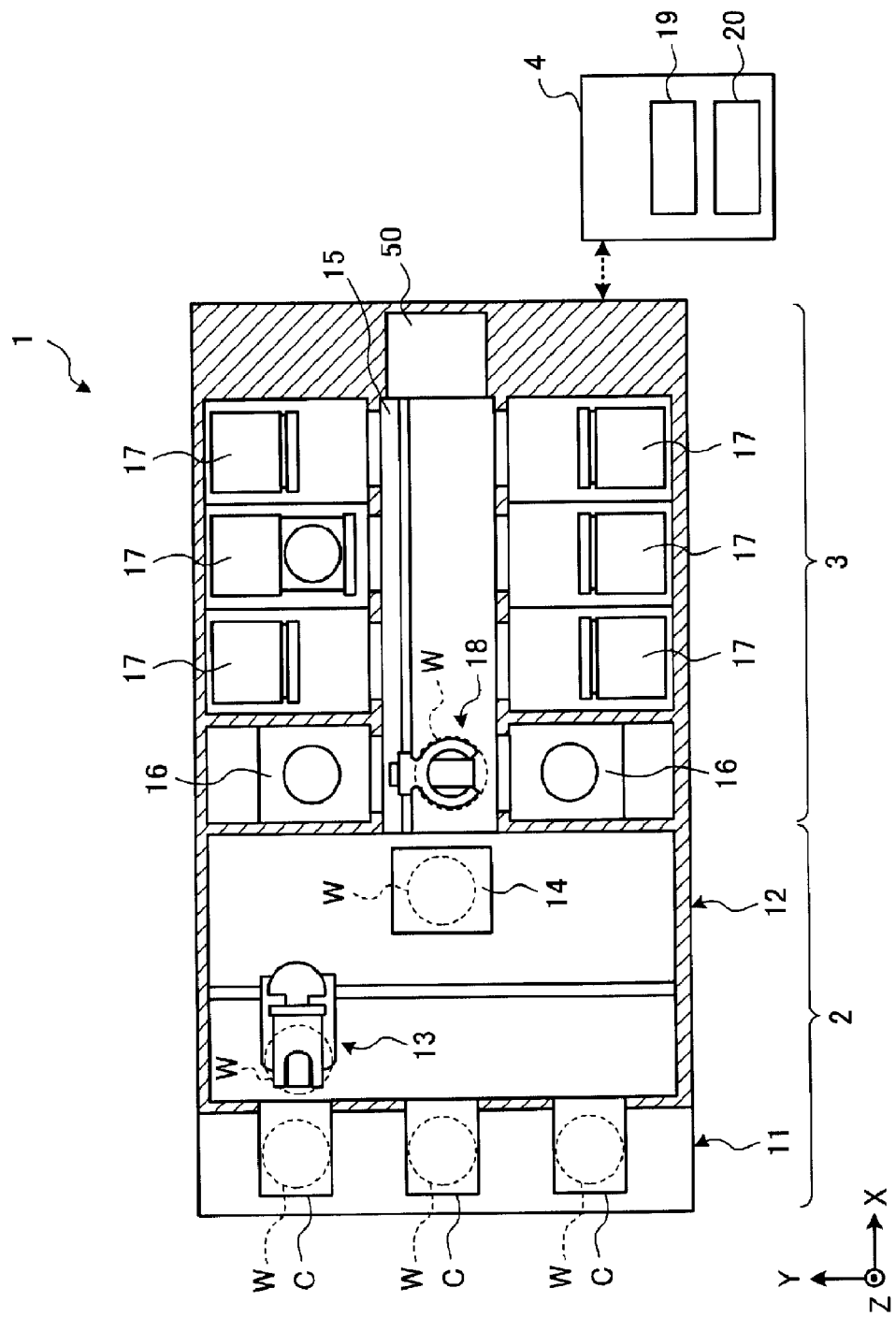
FIG. 8 is a schematic diagram illustrating a schematic configuration of a substrate treatment system according to a modification of the embodiment.

Although the example in which the adjustment part 42 is provided in the delivery part 14 has been described in the above embodiment, the adjustment parts 42 may be provided in other sites. As an example, the cleaning unit 16 may be used as the adjustment part 42. Alternatively, an adjustment unit 50 provided with the adjustment part 42 may be additionally provided in the substrate treatment system 1. FIG. 8 is a schematic diagram illustrating a schematic configuration of a substrate treatment system 1 according to a modification of the embodiment.

As illustrated in FIG. 8, the adjustment unit 50 is provided adjacent to the transfer part 15. The wafer W can be transferred by the transfer part 15. For example, the wafer W which has been determined that the formation state of the liquid film is poor, may be transferred to the adjustment unit 50 where the formation state of the liquid film may be adjusted by the adjustment part 42.

Although the example in which the imaging part 41 is provided adjacent to the drying unit 17 has been described in the above embodiment, the imaging part 41 may be provided in other sites. As an example, in the substrate treatment system 1, the imaging part 41 may be provided in a transfer system (the substrate transfer device 13, the delivery part 14, and the substrate transfer device 18) that transfers the wafer W, and may be provided adjacent to the cleaning unit 16. For example, the imaging part 41 may be provided integrally with the substrate transfer device 13 or the substrate transfer device 18.

In some embodiments, the imaging part 41 may be provided in the above-described adjustment unit 50. In this case, if it is determined that the formation state of the liquid film on the wafer W which is captured by the imaging part 41 of the adjustment unit 50 is poor, the formation state of the liquid film can be adjusted inside the adjustment unit 50 without transferring the wafer W to another site.

This shortens a period of time required to transfer the wafer W, thus shortening the overall processing time of the substrate treatment system 1. Even in a case where both the imaging part 41 and the adjustment part 42 are provided in the delivery part 14, the same effects as those of the above embodiment can be obtained.

Although the example in which one imaging part 41 is provided in the substrate treatment system 1 has been described in the above embodiment, a plurality of imaging parts 41 may be provided in the substrate treatment system 1. For example, the imaging part 41 may include two imaging parts (hereinafter, a first imaging part and a second imaging part). The first imaging part and the second imaging part may be provided at different sites inside the substrate treatment system 1.

Further, in a modification, the determination part 19b may perform the determination process using a difference between an image captured by the first imaging part and an image captured by the second imaging part. FIGS. 9A to 9C are views schematically illustrating an example of the determination process in a modification of the embodiment.

In this modification, the image processing part 19a performs an imaging process based on an image (see FIG. 9A) captured by the first imaging part and an image (see FIG. 9B) captured by the second imaging part, and acquires a difference between the two images (see FIG. 9C). In the example of FIGS. 9A to 9C, first, an absolute value of a difference between a luminance value of each pixel of a liquid film portion 103 in the image captured by the first imaging part and a luminance value of each pixel of a liquid film portion 104 in the image captured by the second imaging part is obtained. Further, among the obtained absolute values of the differential image, pixels having values exceeding a predetermined threshold value are extracted. Thus, island portions 105 formed on the wafer W are obtained.

Further, based on the position or size of the island portions 105 thus obtained, the determination part 19b can determine whether the formation state of the liquid film on the front surface of the wafer W is good. According to this modification, it is possible to more precisely confirm the formation state of the liquid film on the front surface of the wafer W by performing the determination process based on two captured images.

In some embodiments, for example, the first imaging part may be provided in the transfer system (for example, the substrate transfer device 18) and the second image part may be provided adjacent to the drying unit 17. Alternatively, the first imaging part and the second imaging part may be provided at another locations.

Further, in another modification, based on a difference between a predetermined reference image stored in the storage part 20 and an image captured by the imaging part 41, it may be determined whether the formation state of the liquid film on the front surface of the wafer W is good. The predetermined reference image may be an image data on the front surface of the wafer W captured in advance, which is considered that the formation state of the liquid film is good. Accordingly, it is possible to perform the determination using the differential image through one capturing, and confirm the formation state of the liquid film on the front surface of the wafer W in a short period of time. Further, even in the determination process using the differential image, in addition to the luminance, hue, color difference value, and a combination thereof may be used.

The substrate treatment device according to the embodiment includes the liquid treatment part (the cleaning unit 16), the imaging part 41, the determination part 19b, and the post-treatment part (the drying unit 17). The liquid treatment part (the cleaning unit 16) supplies the liquid (the IPA liquid) onto the substrate (the wafer W) to form the liquid film on the substrate (the wafer W). The imaging part 41 captures an image of the front surface of the substrate (the wafer W) on which the liquid film is formed. The determination part 19b determines the quality of the formation state of the liquid film based on the captured image of the substrate (the wafer W). If it is determined that the formation state of the liquid film is good, the post-treatment part (the drying unit 17) perform the treatment on the substrate (the wafer W) on which the liquid film is formed. It is therefore possible to enhance the throughput of the wafer W.

Further, the substrate treatment device according to the embodiment further includes the adjustment part 42 that adjusts the formation state of the liquid film to make the formation state good in the case in which it is determined that the formation state of the liquid film is poor. Accordingly, it is possible to suppress the patterns formed in the portions not covered with the liquid film from collapsing during the drying treatment based on the supercritical fluid.

Further, in the substrate treatment device according to the embodiment, the imaging part 41 is provided adjacent to the post-treatment part (the drying unit 17). Accordingly, it is possible to suppress a degradation in the throughput of the wafer W, which is caused by the drying of the IPA liquid from when the capturing is performed until the drying treatment is initiated.

Further, the substrate treatment device according to the embodiment further includes the transfer system (the substrate transfer device 13, the delivery part 14, and the substrate transfer device 18) which are configured to transfer the substrate (the wafer W). The imaging part 41 is provided in the transfer system (the substrate transfer device 13, the delivery part 14, and the substrate transfer device 18). This makes it possible to confirm the formation state of the liquid film on the front surface of the wafer W when transferring the wafer W.

Further, in the substrate treatment device according to the embodiment, the determination part 19b detects the interface (the edge 100) between the liquid film and the dried portion on the front surface of the substrate (the wafer W), based on a contrast difference of the image captured by the imaging part 41, and determines the quality of the formation state of the liquid film based on the position of the detected interface (the edge 100). This makes it possible to confirm the formation state of the liquid film on the front surface of the wafer W in a short period of time.

Further, in the substrate treatment device according to the embodiment, the imaging part 41 may include the first imaging part and the second imaging part which are configured to capture an image of the front surface of the substrate (the wafer W) at different sites. The determination part 19b determines the quality of the formation state of the liquid film based on the difference between the image of the substrate (the wafer W) captured by the first imaging part and the image of the substrate (the wafer W) captured by the second imaging part. This makes it possible to more precisely confirm the formation state of the liquid film on the front surface of the wafer W.

Further, in the substrate treatment device according to the embodiment, the determination part 19b determines the quality of the formation state of the liquid film based on the difference between the image of the substrate (the wafer W) captured by the imaging part 41 and the predetermined reference image. Accordingly, it is possible to confirm the formation state of the liquid film on the front surface of the wafer W in a short period of time.

Further, in the substrate treatment device according to the embodiment, the post-treatment part (the drying unit 17) brings the substrate (the wafer W) on which the liquid film is formed into contact with the treatment liquid remaining in a supercritical state to dry the substrate (the wafer W). Accordingly, it is possible to suppress the patterns from collapsing during the drying treatment.

Further, in the substrate treatment device according to the embodiment, the liquid treatment part (the cleaning unit 16) includes the cooling part 27 that cools down the liquid (the IPA liquid) to a melting point or higher and at room temperature or less before the liquid (the IPA liquid) for forming the liquid film is discharged onto the substrate (the wafer W). Accordingly, it is possible to suppress a degradation in the throughput of the wafer W.

Further, the substrate treatment method according to the embodiment includes a liquid treatment step (step S11), a capturing step (step S12), a determination step (step S13), and a post-treatment step (step S14). The liquid treatment step (step S11) supplies the liquid (the IPA liquid) onto the substrate (the wafer W) to form the liquid film on the substrate (the wafer W). The capturing step (step S12) captures an image of the front surface of the substrate (the wafer W) on which the liquid film is formed. The determination step (step S13) determines the quality of the formation state of the liquid film based on the captured image of the substrate (the wafer W). The post-treatment step (step S14) performs, if it is determined that the formation state of the liquid film is good, the treatment on the substrate (the wafer W) on which the liquid film is formed. Accordingly, it is possible to enhance the throughput of the wafer W.

Additional effects and modifications can be easily derived by those skilled in the art. Thus, the broader aspects of the present disclosure are not limited to the specific details and representative embodiments shown and described above. Accordingly, various modifications are possible without departing from the spirit or scope of the general inventive concept as defined by the appended claims and their equivalents.

EXPLANATION OF REFERENCE NUMERALS

W: wafer, 1: substrate treatment system, 4: controller, 14: delivery part, 15: transfer part, 16: cleaning unit, 17: drying unit, 19: control part, 19b: determination part, 20: storage part, 41: imaging part, 42: adjustment part, 100: edge

What is claimed is:

1. A substrate treatment device comprising:
a liquid treatment part configured to supply a liquid onto a substrate to form a liquid film remaining in a liquid state on the substrate;
a dryer including:
a body having a housing shape and an opening formed in a first lateral surface of the body to transfer the substrate therethrough and
a fluid supplier configured to supply a supercritical fluid remaining in a supercritical state to the substrate and configured to dry the substrate on which the liquid film is formed by supplying the supercritical fluid to the substrate using the fluid supplier and bringing the substrate on which the liquid film is formed into contact with the supercritical fluid; and
an imaging part installed adjacent to the opening of the dryer, and configured to capture an image of a front surface of the substrate, on which the liquid film remaining in the liquid state is formed;
a controller configured to determine a quality of a formation state of the liquid film, and programmed to perform:
determining the quality of the formation state of the liquid film on the substrate based on the image captured by the imaging part, and
wherein the dryer dries the substrate on which the liquid film is formed, when the formation state of the liquid film is good.

2. The substrate treatment device of claim 1, further comprising:
an adjustment part including a liquid supplier configured to supply the liquid onto the substrate, and configured to adjust the formation state of the liquid film,
wherein the controller is further programmed to perform:
adjusting, by the adjustment part, the formation state of the liquid film by supplying the liquid on the substrate from the liquid supplier of the adjustment part such that the formation state of the liquid film becomes good, when the controller determines that the formation state of the liquid film is poor.

3. The substrate treatment device of claim 1, wherein the controller is configured to detect an interface between the liquid film and a dried portion of the liquid on the front surface of the substrate based on a contrast difference of the image captured by the imaging part, and to determine the quality of the formation state of the liquid film based on a position of the detected interface.

4. The substrate treatment device of claim 3, wherein the liquid treatment part includes a cooler configured to cool down the liquid, and
wherein the controller is further programmed to perform:
cooling down, by the cooler, the liquid to a melting point or higher and at a room temperature or less, before the liquid for forming the liquid film is discharged onto the substrate.

5. The substrate treatment device of claim 1, further comprising an additional imaging part,
  wherein the imaging part and the additional imaging part are configured to capture the front surface of the substrate at different sites, and
  wherein the controller is further programmed to perform: determining the quality of the formation state of the liquid film based on a difference between an image of the substrate captured by the imaging part and an image of the substrate captured by the additional imaging part.

6. The substrate treatment device of claim 1, wherein the controller is further programmed to perform: determining the quality of the formation state of the liquid film based on a difference between the image captured by the imaging part and a predetermined reference image.

7. The substrate treatment device of claim 1, wherein the liquid treatment part includes a cooler configured to cool down the liquid, and
  wherein the controller is further programmed to perform: cooling down, by the cooler, the liquid to a melting point or higher and at a room temperature or less, before the liquid for forming the liquid film is discharged onto the substrate.

8. A substrate treatment method using the substrate treatment device of claim 1, the substrate treatment method comprising:
  a liquid treatment step of supplying a liquid onto a substrate to form a liquid film remaining in a liquid state on the substrate;
  an imaging step of, by the imaging part installed adjacent to the opening formed in the first lateral surface of the body of the dryer, capturing an image of a front surface of the substrate, on which the liquid film remaining in the liquid state is formed;
  a determination step of determining a quality of a formation state of the liquid film based on the image; and
  a drying step of, by the dryer, drying the substrate on which the liquid film is formed, when it is determined in the determination step that the formation state of the liquid film is good.

9. The substrate treatment device of claim 1, wherein the fluid supplier of the dryer includes:
  a fluid supply header configured to supply the supercritical fluid into the body and installed adjacent to a second lateral surface opposite to the opening in an interior of the body; and
  a fluid discharge header configured to discharge the supercritical fluid outward of the body and installed adjacent to the first lateral surface below the opening.

* * * * *